United States Patent [19]
Neuberger

[11] Patent Number: 5,771,325
[45] Date of Patent: Jun. 23, 1998

[54] MODULAR LASER SYSTEM

[75] Inventor: Wolfgang Neuberger, F. T. Labuan, Malaysia

[73] Assignee: Ceram Uptec Industries, Inc., East Longmeadow, Mass.

[21] Appl. No.: 724,082

[22] Filed: Sep. 30, 1996

[51] Int. Cl.[6] ...................................................... C02B 6/36
[52] U.S. Cl. .............................. 385/89; 385/121; 385/92; 385/93
[58] Field of Search ............................... 385/88–93, 115, 385/121

[56] References Cited

U.S. PATENT DOCUMENTS

| 5,051,578 | 9/1991 | Slemon et al. | 395/88 |
| 5,666,447 | 9/1997 | Chuang et al. | 385/89 |

FOREIGN PATENT DOCUMENTS

| 63-212909 | 9/1988 | Japan | 385/89 |

*Primary Examiner*—John Ngo
*Attorney, Agent, or Firm*—Bolesh J. Skutnik; Mark Giarratana

[57] ABSTRACT

In a modular laser system, a plurality of laser modules are interchangeably mounted on a support rack with each laser module transmitting an output beam to a respective optical pump fiber, and the plurality of pump fibers are optically coupled to a laser rod for generating a combined output beam. A laser diode array is mounted within a sealed chamber of each module, and an output wave-guide of each module is coupled through a plurality of optical fibers to the diode array to receive the laser emissions. The other end of each output wave-guide has a first connector, and each pump fiber has a corresponding second connector permitting the output wave-guides to be interchangeably connected to the pump fibers. A control circuit of each laser module monitors the status of its laser diodes, the voltage and current supplied thereto, and the temperature conditions, and generates signals indicative of these parameters for detecting and replacing failed or defective laser modules. During replacement of a laser module, the other modules may continue to operate and generate a system output beam (albeit at a lower power level) thus permitting virtually continuous system operation.

19 Claims, 2 Drawing Sheets

MODULAR LASER SYSTEM

BACKGROUND OF THE INVENTION

1. Field of the Invention

The present invention relates to lasers, and more particularly, to a modular laser system having a plurality of interchangeable laser modules, wherein each module has one or more laser sources, such as semiconductor or diode lasers, and all of the laser modules are optically coupled to a common output port for generating a combined output beam of laser radiation.

2. Information Disclosure Statement

Prior art laser systems used for industrial applications may typically comprise one or more flash lamps coupled to a laser rod for pumping the rod to generate laser radiation. One of the drawbacks encountered with these types of systems is that the flash lamps have a relatively limited life expectancy, and when a flash lamp fails, this can cause the entire laser system to shut down. The service time required to change or repair a flash lamp may be considerable. In industrial applications, such as in the automotive industry, this type of down time may be prohibitively expensive, since it will typically lead to disruptions in the flow of related manufacturing processes or procedures, and may indeed lead to temporary shut down of an entire assembly line.

Because semiconductor laser sources, such as laser diodes, have a greater operational life expectancy than do flash lamps (e.g., the life expectancy of a laser diode may be on the order of about 1000 hours), the use of laser diodes instead of flash lamps to either pump such laser systems or operate as direct sources of laser radiation, should improve the situation. However, the significantly increased operational life expected of laser diodes has not yet been consistently attained. In addition, even if the improved life expectancy of laser diodes is repeatedly attained, there will likely still be the problem of system shut down when one or more laser diodes fail. The repair, removal and/or replacement of failed laser diodes may likewise require system shut down leading to significant expense.

Accordingly, it is an object of the present invention to overcome such drawbacks and disadvantages of prior art laser systems.

SUMMARY OF THE INVENTION

The present invention is directed to a modular laser system comprising a support frame, and a plurality of laser modules interchangeably mounted on the support frame. Each laser module includes at least one laser source, preferably a laser diode or diode array, and an output port coupled to the laser diodes for receiving the laser emissions. A plurality of wave-guides are interchangeably coupled to the module output port for receiving the laser radiation emitted from the operational modules, and a system output port is coupled to the plurality of wave-guides for receiving and generating a combined output beam of laser radiation.

In one embodiment of the present invention, the system output port is formed by a laser rod, and each of the plurality of wave-guides is formed by a pump fiber optically coupled between the laser rod and a respective module output port. Each laser module preferably includes its own output connector for interchangeably connecting each module output port to its corresponding pump fiber. Each laser module also preferably includes a control circuit for monitoring the status of its laser diodes and the voltage or current supplied thereto. A suitable heat transfer system may be incorporated into each laser module to maintain temperature and/or wavelength stabilization.

One advantage of the modular laser system of the present invention is that if one or more of the laser sources fail the failed module can be easily replaced with an operational module, and the other modules may continue to operate during the repair and/or replacement procedure to generate the combined output beam. Accordingly, the modular laser system of the present invention may provide virtually continuous operation without the down time and repair expense associated with the prior art systems described above.

Other advantages of the present invention will become apparent in view of the following detailed description and accompanying drawings.

DETAILED DESCRIPTION OF A PREFERRED EMBODIMENT

Figure 1:
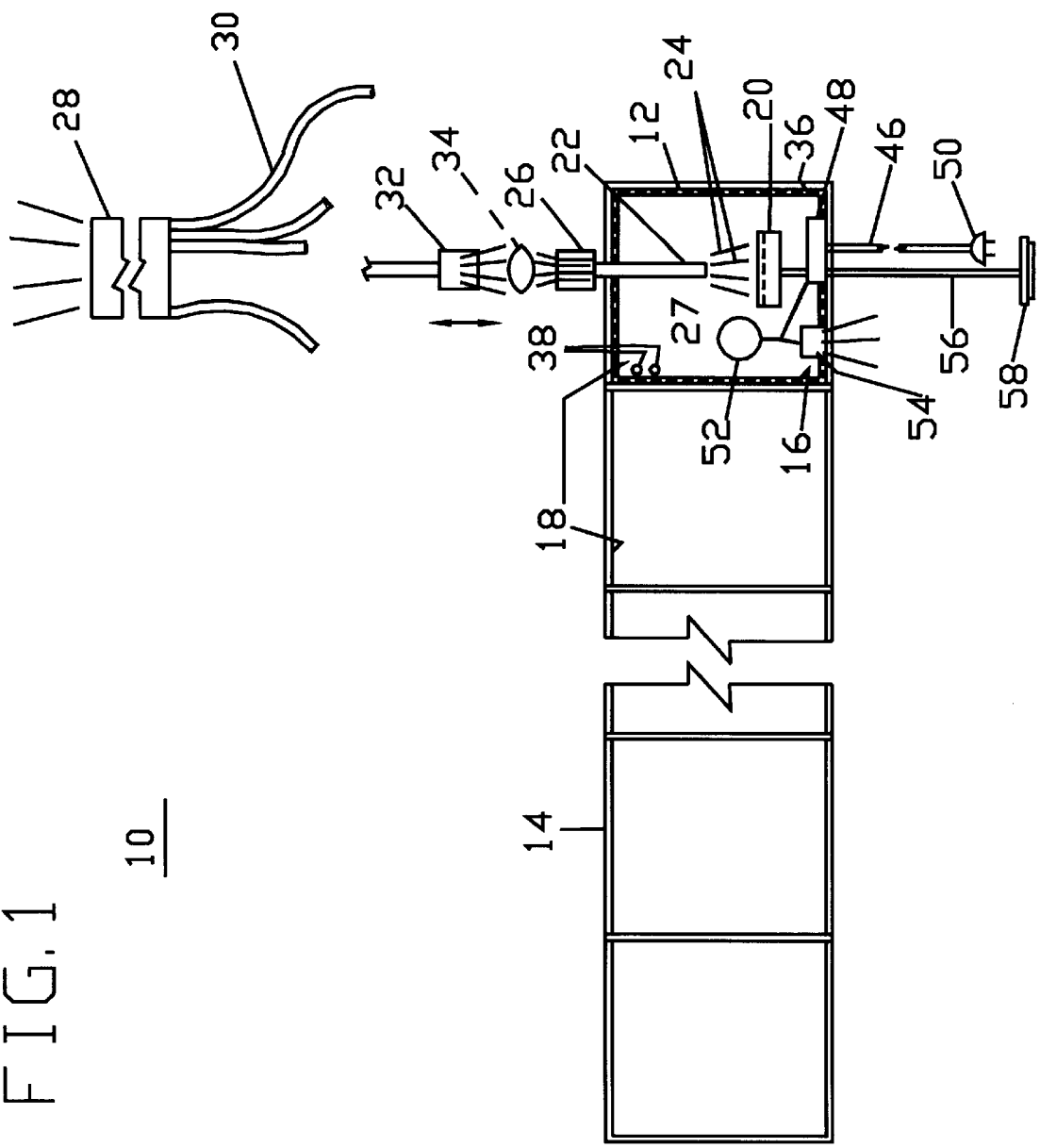
FIG. 1 is a somewhat schematic, partial cross-sectional plan view of a modular laser system embodying the present invention.

In FIG. 1, a modular laser system embodying the present invention is indicated generally by reference numeral 10. Laser system 10 includes a plurality of laser modules 12 interchangeably mounted on support frame or rack 14. Each laser module 12 comprises housing 16 defining a generally rectangular foot print, and support frame 14 defines a plurality of rectangular-shaped recesses 18 for receiving and interchangeably mounting the modules on the frame. If necessary, one or more clips or other suitable fasteners (not shown) may be employed to interchangeably fasten each laser module to the support frame.

As will be recognized by those skilled in the pertinent art, any of numerous known means may be employed for interchangeably mounting laser modules 12 within modular system 10. For example, each laser module may include mounting pins adapted to be received within corresponding holes or pin apertures formed in the support frame, or may include another type of fastening and/or alignment mechanism for relatively rapid and easy interchangeable mounting of the laser modules within the system. Similarly, the module housing and/or supporting surfaces of the frame may take any of numerous different shapes and/or configurations facilitating the interchangeability of the modules.

As shown in FIG. 1, each laser module 12 includes semiconductor or diode laser array 20 mounted within housing 16, which is coupled to means for collecting the laser emissions of the array and transmitting the emissions to wave-guide 22 forming an output port of the module. In the embodiment of the present invention illustrated, the radiation collecting means of each module comprises a plurality of optical fibers 24, each of which is optically coupled to a respective diode of laser array 18 to receive a substantial portion of the laser emissions. Optical fibers 24 may in turn be wrapped in a bundle to form output wave-guide 22, or another suitable type of wave-guide may be employed. First optical connector 26 is attached to the other end of each output wave-guide 22 permitting the respective module to be interchangeably coupled to a system output port.

As will be recognized by those skilled in the pertinent art, although semiconductor lasers are relatively inexpensive and a currently preferred source of laser radiation, each laser module may include a different type of laser source if desired, or may include any number of semiconductor lasers or other laser types. Each module housing 16 preferably defines a sealed chamber 27 for receiving the semiconductor lasers or laser array to maintain substantially dust-free conditions for the sensitive diode emitters, particularly during module interchange.

The plurality of module output ports 22 are optically coupled to means for collecting the radiation emitted by each operational laser module and generating a combined laser beam at a system output port. In the embodiment of the present invention illustrated, this means includes a laser rod 28 optically coupled to a plurality of pump fibers 30, each of which is in turn coupled to a respective module output port 22 for receiving laser radiation from the respective module and transmitting the radiation to the laser rod. Each pump fiber 30 includes a second optical connector 32 mounted on its free end, and adapted to be connected to the first connector 26 of the respective laser module. As indicated in phantom in FIG. 1, a suitable lens 34 may be mounted either on the end of each pump fiber 30 or within each module output port to reduce beam divergence at the connector interface.

The first and second optical connectors 26 and 32, respectively, may be any of numerous suitable connectors known to those of ordinary skill in the pertinent art. Preferably, the connectors are of a type or configuration permitting them to be connected and disconnected without tools, and which ensure proper alignment of the optical fibers upon connection. For example, a male plug 26 and female socket 32, as shown typically in FIG. 1, may facilitate relatively quick and easy replacement of the interchangeable laser modules.

Each laser module 12 also includes suitable means for transferring heat away from the module, and particularly away from the diode laser array, during laser operation. As shown schematically in FIG. 1, each module housing 16 includes a liquid-to-air heat exchanger formed by one or more liquid-flow channels 36 extending through the side walls of the housing. In this embodiment of the invention, each module housing 16 is made of a thermally-conductive material, such as copper, aluminum or other suitable metal, and, if necessary, the walls of each housing may include thermally-conductive fins (not shown) for facilitating heat transfer.

Figure 2:
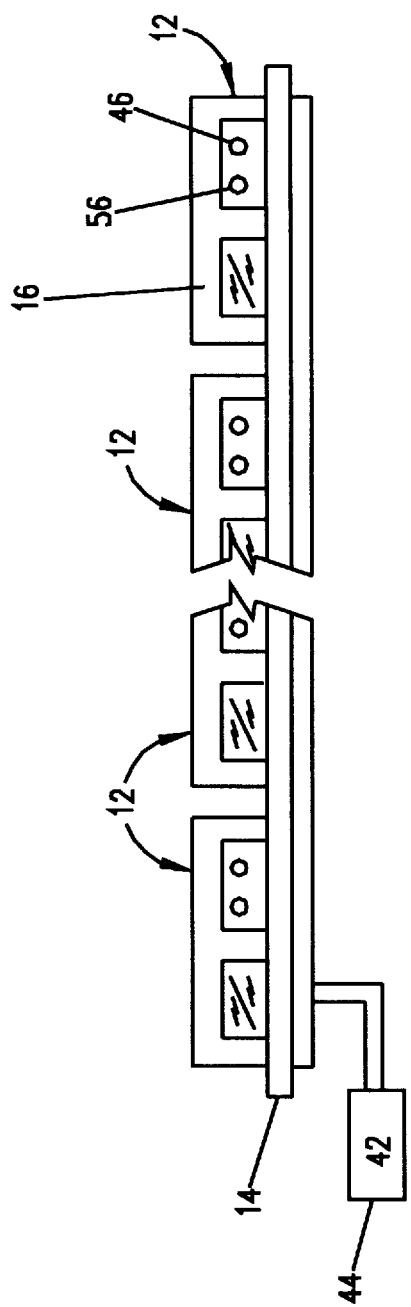
FIG. 2 is a side elevational view of the laser system of FIG. 1 with some components removed for clarity.

Each module housing 16 also includes coolant inlet and outlet ports 38, which are in turn coupled in fluid communication to a coolant manifold 40 mounted on the support frame 14 beneath the laser modules (FIG. 2). The manifold 40 is in turn coupled to a pump 42 for pumping the coolant through the heat exchange conduits of the laser modules, and may in turn be coupled in fluid communication with a heat exchanger 44 for facilitating heat transfer from the coolant. The liquid-to-air heat transfer system is particularly suitable for maintaining dust-free conditions within the chamber 27 of the module. However, as will be recognized by those skilled in the pertinent art, any of numerous known means for heat transfer may be employed to cool or otherwise regulate the temperature of the laser modules and/or of the laser source of each module. For example, it may also be desirable to employ one or more cooling fans for blowing air through or across each laser module. In this situation, the sensitive diode emitters may be sealed to maintain dust-free conditions in a different manner than that described above.

Each laser module 12 also includes a power line 46 coupled through a wiring panel 48 to the diode array 20 and other electronic components of the module. The power line 46 includes a suitable electrical connector 50 for connecting the line and module to a voltage source. As shown schematically in FIG. 1, each module 12 also includes a control circuit 52 of a type known to those of ordinary skill in the pertinent art for monitoring the status of its laser diodes and the voltage or current supplied thereto. A status indicator lamp 54 is preferably connected to the control circuit 52 and is mounted on an exterior wall of each module housing to generate a warning signal indicative of a diode failure or other laser module malfunction. The control circuit 52 may also include a thermocouple or other suitable temperature sensor for monitoring the diode temperature(s). The control circuit may in turn be coupled to the heat-exchange pump 42 or to a suitable valve (not shown) for controlling coolant flow through the respective module, and to thereby maintain temperature and/or wavelength stabilization.

As will be recognized by those skilled in the pertinent art, the output port 22 of each module, and the means for collecting the radiation from the plurality of output ports may include any of numerous known types of optical fibers or other wave-guides. For example, an optical fiber having a rectangular cross section and suitable for use in the system of the present invention is disclosed in co-pending U.S. Pat. No. 5,566,767, entitled "Flat Surfaced Optical Fibers and Diode Laser Medical Devices", invented by present inventor Wolfgang Neuberger, and assigned to the Assignee of the present invention, which is hereby expressly incorporated by reference as part of the present disclosure.

As will also be recognized by those skilled in the pertinent art, numerous means may be employed for efficiently combining the beams of the individual laser modules, for optimizing the power transfer at the junctions between the diodes and optical fibers or other wave-guides, and for preserving the brightness of the beams over the wave-guide lengths. Suitable components for performing these functions are disclosed in co-pending U.S. patent application Ser. No. 08/553,140, entitled "Compound Laser Systems For High Power Densities", filed in the names of Wolfgang Neuberger et al., and assigned to the Assignee of the present invention, which is also hereby expressly incorporated by reference as part of the present disclosure.

Each laser module 12 also includes a data connection line 56 coupled to the control circuit 52 and having a suitable connector 58 for transmitting data to a central processing unit of the system (not shown) indicative of diode status, voltage or current levels, diode array temperatures, or other system or operational parameters. As will be recognized by those skilled in the pertinent art, the central processing unit may be controlled to interrogate or otherwise continuously monitor the status of each laser module, and to generate a warning or alarm signal indicative of system malfunctions or failures requiring the removal or replacement of one or more interchangeable laser modules.

One advantage of the modular laser system of the present invention is that when a diode laser or laser array fails, the respective laser module may be relatively quickly and easily removed and replaced with a new or operational laser module. A significant additional advantage is that the modular laser system does not have to be shut down during module replacement. Rather, because the laser modules are coupled to the laser rod 28 or system output port in a parallel relationship relative to each other, the other laser modules may continuously operate during the repair or replacement of a defective laser module. Accordingly, although the modular laser system will operate at a power level which is reduced in proportion to the number of failed laser modules, it will nevertheless continue to operate. For many industrial applications, a temporary reduction in power output or overall power of the laser system is acceptable so long as the reduction is within design limits. The greater the number of laser modules mounted in each system of the invention, the lesser will be the effect of each failed module on the system's overall output. Accordingly, the modular laser system of the present invention is significantly more reliable than the prior art systems described above, and may be able to operate on a virtually continual basis despite individual laser failures. In addition, the service costs involved with system maintenance, and the repair and replacement of failed laser diodes (or other components) should be significantly reduced in comparison to the prior art due to the unique modular design of the present invention.

As will be recognized by those skilled in the pertinent art, numerous modifications may be made to the above-described and other embodiments of the present invention without departing from its scope as defined in the appended claims. For example, rather then use the semiconductor lasers of the modules to pump a laser rod, it may be desirable to use the semiconductor lasers as a direct source of laser radiation and to combine the module beams at a system output port. In addition, numerous different types of structures or configurations may be employed for interchangeably mounting the laser modules within the modular system in accordance with the present invention. The number of laser modules, or the number of lasers mounted within each module, may likewise be varied to meet the requirements of a particular application. Accordingly, this detailed description of a preferred embodiment is to be taken in an illustrative, as opposed to a limiting sense.

What is claimed is:

1. A modular laser system comprising:
   a plurality of laser modules, each including at least one laser source for emitting laser radiation;
   an output port coupled to said at least one laser source for transmitting radiation emitted by said at least one laser source;
   means for interchangeably mounting a laser module within said modular laser system;
   means for collecting radiation emitted by said plurality of laser modules and generating a combined beam of radiation; and
   means for interchangeably connecting each module port to said means for collecting radiation emitted by said plurality of laser modules.

2. A modular laser system as defined in claim 1, wherein said at least one laser source of each module is a semiconductor laser.

3. A modular laser system as defined in claim 2, wherein each laser module includes an output wave-guide optically coupled to each semiconductor laser and forming said respective module output port.

4. A modular laser system as defined in claim 1, wherein said means for interchangeably connecting includes a plurality of female connectors and corresponding male connectors adapted to be received within and connected to said female connectors, and wherein each male connector is coupled to one of a respective module output port and said means for collecting radiation, and said corresponding female connector is coupled to said other of said respective module output port and said means for collecting radiation.

5. A modular laser system as defined in claim 1, wherein each laser module includes a module housing defining a chamber receiving said at least one laser source.

6. A modular laser system as defined in claim 5, further comprising at least one frame supporting said plurality of interchangeable laser modules, wherein said means for interchangeably mounting includes a plurality of mounting surfaces and corresponding mounting recesses for receiving said mounting surfaces to interchangeably mount said module housings on said support frame, and wherein each mounting surface is formed on one of each module housing and said support frame, and said corresponding mounting recess is formed on said other of each module housing and said support frame.

7. A modular laser system as defined in claim 1, wherein said means for collecting radiation and generating a combined beam includes a plurality of pump fibers and a laser rod, and each pump fiber is optically coupled between said laser rod and a respective module output port for transmitting laser emissions from said operational laser modules to said laser rod and generating a combined output beam.

8. A modular laser system as defined in claim 1, further comprising means for transferring heat away from said at least one laser source of each laser module.

9. A modular laser system as defined in claim 8, wherein said means for transferring heat includes at least one coolant flow channel defined by each laser module for receiving coolant flow therethrough.

10. A modular laser system as defined in claim 1, wherein each laser modulefurther comprises means for monitoring operational status of said respective laser source and generating signals indicative thereof.

11. A modular laser system as defined in claim 10, wherein each laser module further comprises means for monitoring temperature of said respective laser source and generating signals indicative thereof.

12. A modular laser system, comprising:
    at least one support frame;
    a plurality of laser modules interchangeably mounted on said at least one support frame, each laser module including at least one laser source for emitting laser radiation, and an output port coupled to said least one laser source for transmitting radiation emitted by said at least one laser source;
    a plurality of wave-guides, each interchangeably coupled to a respective module output port for receiving said laser radiation emitted therefrom; and
    a system output port coupled to said plurality of wave-guides for receiving radiation emitted therefrom and generating a combined output beam of laser radiation.

13. A modular laser system as defined in claim 12, wherein each laser source is one of a laser diode or an array of laser diodes.

14. A modular laser system as defined in claim 12, wherein each laser module includes an output wave-guide optically coupled to each laser source and forming said respective module output port.

15. A modular laser system as defined in claim 14, further comprising a plurality of first connectors and corresponding second connectors adapted to be connected to said first connectors, and wherein each first connector is coupled to a respective module output port and said corresponding second connector is coupled to a respective wave-guide for interchangeably connecting said module output ports to said wave-guides.

16. A modular laser system as defined in claim 12, further comprising a plurality of mounting surface areas and corresponding mounted recesses for interchangeably receiving said mounting surface areas, wherein each mounting surface area is defined by one of a respective laser module and said support frame, and said corresponding mounting recess is defined by the other of said respective laser module and said support frame for interchangeably mounting said laser modules on said support frame.

17. A modular laser system as defined in claim 12, wherein each wave-guide is a pump fiber, and said system output port is defined by a laser rod optically coupled to said plurality of pump fibers for receiving said laser emissions of said operational laser modules and generating a combined output beam.

18. A modular laser system as defined in claim 12, wherein each laser module further includes a control circuit coupled to said respective laser source for monitoring said operational status of said respective laser source and generating signals indicative thereof.

19. A modular laser system as defined in claim 12, wherein each laser module further comprises a heat transfer connection for receiving a coolant fluid to transfer heat away from said respective laser source.

\* \* \* \* \*